United States Patent
Appeltans et al.

(10) Patent No.: US 6,178,083 B1
(45) Date of Patent: Jan. 23, 2001

(54) LAYERED CAPACITOR DEVICE

(75) Inventors: Koen Emiel Jozef Appeltans, Sint-Truiden; Jean Henri Pierre Louis Boxho, Woluwe-Saint-Lambert, both of (BE); Damien Luc François Macq, Wake Forest, NC (US); Wim Andre Roger Vanderbauwhede, Ghent (BE)

(73) Assignee: Alcatel, Paris (FR)

( * ) Notice: Under 35 U.S.C. 154(b), the term of this patent shall be extended for 0 days.

(21) Appl. No.: 09/544,477

(22) Filed: Apr. 7, 2000

(30) Foreign Application Priority Data

Apr. 9, 1999 (EP) .................................. 99400876

(51) Int. Cl.[7] .................................. H01G 4/228
(52) U.S. Cl. .................. 361/306.1; 361/301.4; 361/306.3; 361/321.2; 257/532; 257/540
(58) Field of Search .............. 361/301.4, 303–304, 361/306.3, 313, 321.2, 321.5, 328, 306.1; 257/532, 540

(56) References Cited

U.S. PATENT DOCUMENTS

| | | | |
|---|---|---|---|
| 4,424,552 | 1/1984 | Saint Marcoux | 361/306 |
| 5,168,433 * | 12/1992 | Mukouyama et al. | 361/502 |
| 5,745,335 * | 4/1998 | Watt | 361/313 |
| 5,874,757 | 2/1999 | Chao | 257/303 |
| 5,978,206 * | 11/1999 | Nishimura et al. | 361/303 |
| 6,031,711 * | 2/2000 | Tennent et al. | 361/303 |

* cited by examiner

Primary Examiner—Kristina Kincaid
Assistant Examiner—Nguyen Ha
(74) Attorney, Agent, or Firm—Sughrue, Mion, Zinn, Macpeak & Seas, PLLC

(57) ABSTRACT

A layered capacitor device with high capacitance per unit area is realized by alternating in the vertical direction first layers (FL1, FL2, FL3, FL4, FL5) and second layers (SL1, SL2, SL3, SL4). A first layer (FL) consists of horizontally alternating electrically conducting tracks (T2,2; T2,3) and electrically insulating tracks, whereas a second layer includes of electrically insulating material, e.g. an oxide. In this way top-bottom capacitors ($C_{TB}$) and side-wall capacitors ($C_{SW}$) are constituted that are parallel coupled to form the layered capacitor device. In a preferred embodiment of the invention, this parallel coupling is realized by conductively interconnecting diagonally neighboring electrically conducting tracks (T1,2; T2,3).

3 Claims, 2 Drawing Sheets

LAYERED CAPACITOR DEVICE

BACKGROUND OF THE INVENTION

The present invention relates to a layered capacitor device and an integrated circuit comprising such a capacitor device.

Such a layered capacitor device is already known in the art, e.g. from the U.S. Pat. No. 4,656,557, entitled *'Electrical Layer Capacitor and Method for the Manufacture Thereof'*. Therein, a layered capacitor device is described that is formed by an alternating superposition of electrically conducting layers, called metal coatings in the cited U.S. Patent, and electrically insulating layers, called plastic films in the cited U.S. Patent. In this way, a longitudinal stack of individual capacitors is constructed. Metal coatings of a same polarisation are interconnected so that the individual capacitors become parallel coupled. In case a layered capacitor which forms part of an integrated circuit is given the structure known from U.S. Pat. No. 4,656,557 by alternating superposition of metal layers and oxide layers, the realised capacitance per unit chip area is small.

SUMMARY OF THE INVENTION

An object of the present invention is to provide a layered capacitor device similar to the known one but through which the realised capacitance per unit area increases significantly.

According to the invention, this object is achieved by a layered capacitor device comprising the parallel coupling of a plurality of capacitors constituted by vertically alternating first and second layers, the second layers consisting of electrically insulating material, wherein the first layers consist of horizontally alternating electrically conducting tracks and electrically insulating tracks, whereby top-bottom capacitors are constituted by two vertically neighboring electrically conducting tracks and a second layer of said second layers therebetween, and whereby side-wall capacitors are constituted by two horizontally neighboring said electrically conducting tracks and an electrically insulating track of said electrically insulating tracks therebetween, said top-bottom capacitors and said side-wall capacitors constituting said plurality of capacitors.

In this way, the realised capacitance is the superposition of vertically oriented or top-bottom capacitors and horizontally oriented or side-wall capacitors. The latter side-wall capacitors are bigger than the top-bottom capacitors because the spacing between horizontally neighbouring metal tracks typically is smaller than the spacing between vertically neighbouring metal tracks as a result of the thickness of the insulating layers. Moreover, fringing electrical fields between side-walls of a metal track and top or bottom plates of other metal tracks also have an increasing effect on the realised capacitance per unit area.

It is to be noticed that the term 'comprising', used in the claims, should not be interpreted as being limitative to the means listed thereafter. Thus, the scope of the expression 'a device comprising means A and B' should not be limited to devices consisting only of components A and B. It means that with respect to the present invention, the only relevant components of the device are A and B.

An additional feature of the layered capacitor device according to the present invention is defined by claim 2.

In this way, by electrically interconnecting all diagonally neighbouring metal tracks, all top-bottom capacitors and all side-wall capacitors become parallel coupled between two contact points of the capacitor device. If the metal tracks are supposed to be labelled with a row index and column index in accordance with their position in the capacitor device, the first contact point is electrically connected to all metal tracks whose row index and column index, when added together, constitute an odd number and the second contact point is electrically connected to all metal tracks whose row index and column index, when added together, constitute an even number.

As described by claim 3, a capacitor device with a structure according to the present invention is suitable for integration in an integrated circuit, because the area occupied by the integrated circuit is reduced significantly in comparison with an integrated circuit wherein the same aggregate capacitance is realised via a capacitor device with the known structure.

BRIEF DESCRIPTION OF THE DRAWINGS

The above mentioned and other objects and features of the invention will become more apparent and the invention itself will be best understood by referring to the following description of an embodiment taken in conjunction with the accompanying drawings wherein.

DETAILED DESCRIPTION OF THE INVENTION

Figure 1:
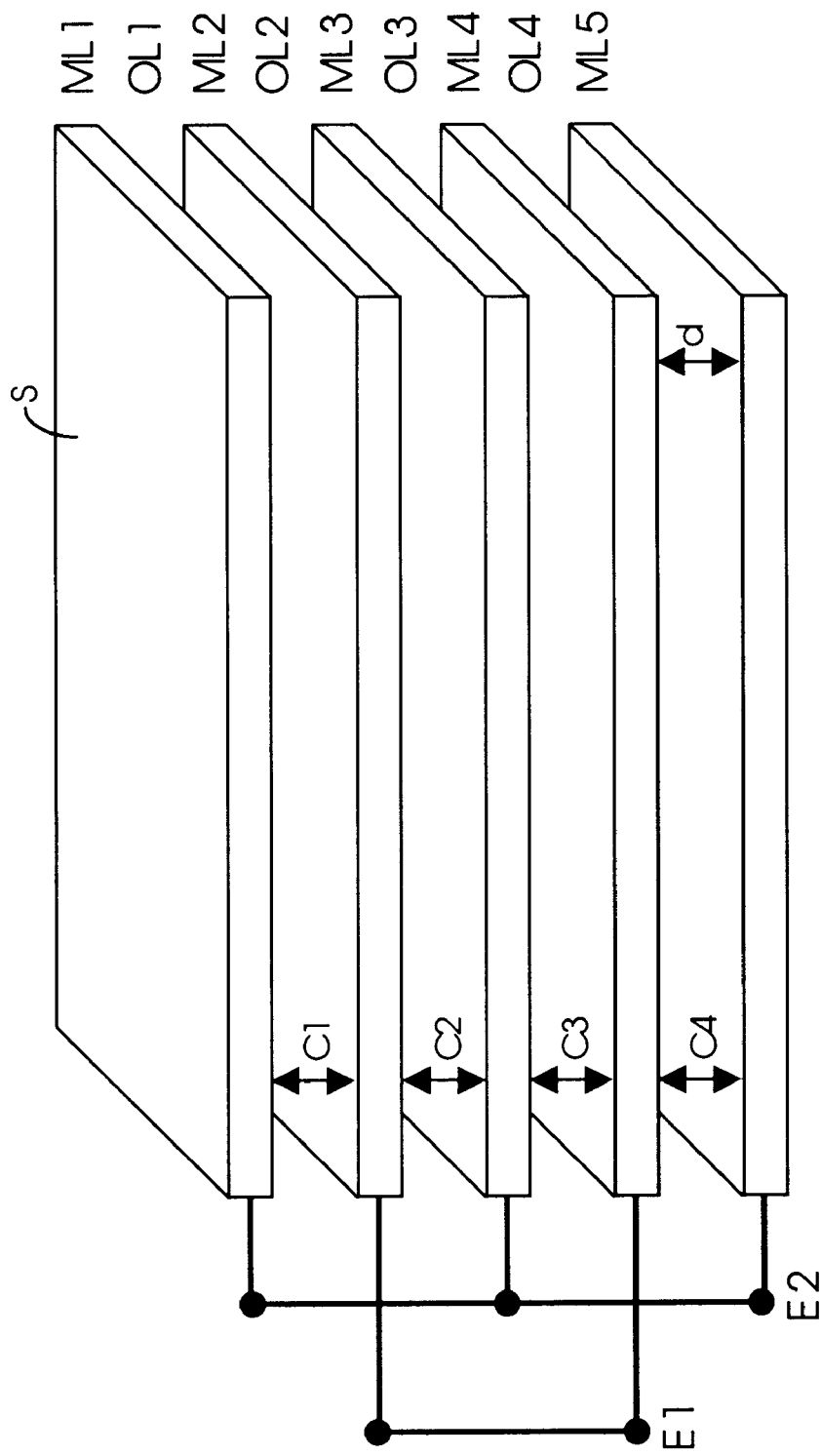
FIG. 1 represents a three dimensional illustration of the structure of an embodiment of the known capacitor device.

The capacitor device drawn in FIG. 1 consists of five metal layers ML1, ML2, ML3, ML4 and ML5, four oxide layers OL1, OL2, OL3 and OL4, a first electrically conductive path E1 and a second electrically conductive path E2. The metal layers ML1, ML2, ML3, ML4 and ML5 have a rectangular surface S. The oxide layers have a thickness d. The metal layers ML1, ML2, ML3, ML4 and ML5 and the oxide layers OL1, OL2, OL3 and OL4 are alternatingly superimposed to form a vertical stack. The first electrically conductive path E1 interconnects the second metal layer ML2 with the fourth metal layer ML4 and constitutes a first terminal of the capacitor device. The second electrically conductive path E2 interconnects the first metal layer ML1, the third metal layer ML3 and the fifth metal layer ML5, and constitutes a second terminal of the capacitor device.

The capacitor device of FIG. 1, which is for example manufactured via a 5 layer submicron CMOS technology, has a well-known structure: a longitudinal stack of parallel coupled capacitors C1, C2, C3 and C4. The capacitor C1, formed by the first metal layer ML1, the first oxide layer OL1 and the second metal layer ML2 has a capacitance value given by the formula:

$$C1 = \varepsilon_0 \cdot \varepsilon_r \cdot \frac{S}{d}$$

Herein, $\varepsilon_0$ represents the permittivity of air and $\varepsilon_r$ represents the relative permittivity of the oxide where the first oxide layer OL1 is made of. The second capacitor C2, formed by the second metal layer ML2, the second oxide layer OL2 and the third metal layer ML3, the third capacitor C3 formed by the third metal layer ML3, the third oxide layer OL3 and the fourth metal layer ML4, and the fourth capacitor C4 formed by the fourth metal layer ML4, the fourth oxide layer OL4 and the fifth metal layer ML5 each have a capacitance value equal to that of the first capacitor C1 since the thickness d is supposed to be equal for all oxide layers OL1, OL2, OL3 and OL4, each oxide layer OL1, OL2, OL3 and OL4 is supposed to be made of the same oxide, and each metal layer ML1, ML2, ML3, ML4 and ML5 is supposed to have the same horizontal surface area S. As a result, the capacitor device of FIG. 1 realises between its first terminal and its second terminal a capacitance value given by:

$$C = C1 + C2 + C3 + C4 = 4 \cdot C1 = 4 \cdot \varepsilon_0 \cdot \varepsilon_r \cdot \frac{S}{d}$$

The capacity per unit silicon area or capacitor density obtained for the capacitor device of FIG. 1 with the known longitudinal stacked structure consequently equals:

$$D_C = \frac{C}{S} = \frac{4 \cdot \varepsilon_0 \cdot \varepsilon_r}{d}$$

Figure 2:
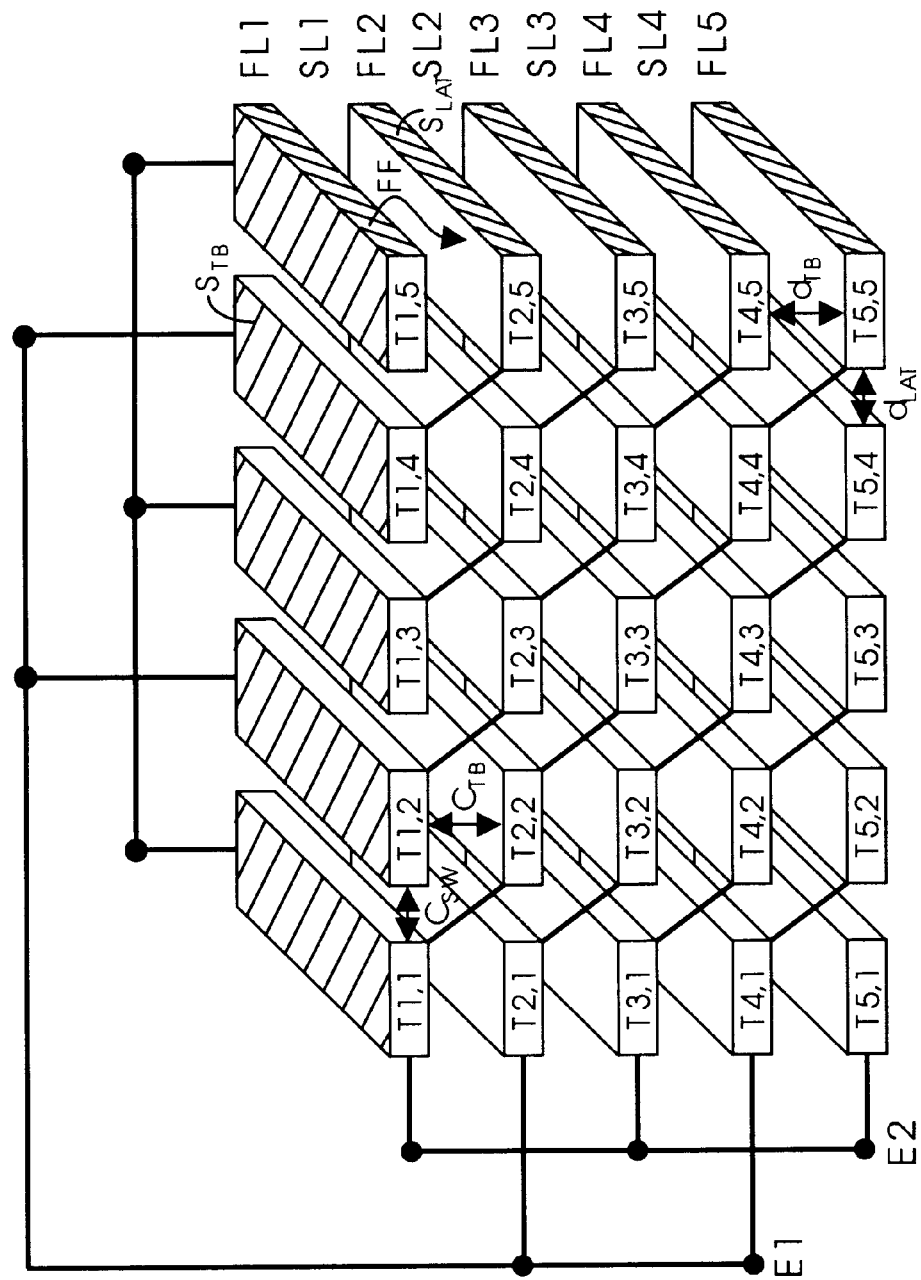
FIG. 2 represents a three dimensional illustration of the structure of an embodiment of the capacitor device according to the present invention.

The capacitor device drawn in FIG. 2 also contains five metal layers FL1, FL2, FL3, FL4 and FL5, four oxide layers SL1, SL2, SL3 and SL4, a first electrically conductive path E1 and a second electrically conductive path E2. The metal layers FL1, FL2, FL3, FL4 and FL5 and the oxide layers SL1, SL2, SL3 and SL4 are alternatingly superimposed to constitute the capacitor device. The metal layers FL1, FL2, FL3, FL4 and FL5 in the capacitor device of FIG. 2 however contain spacings filled with the oxide where also the oxide layers SL1, SL2, SL3 and SL4 are made of. More particularly, each metal layer FL1, FL2, FL3, FL4 and FL5 in lateral direction consists alternatingly of metal tracks and oxide tracks. Each metal track has a top surface and a bottom surface area $S_{TB}$, and two side-wall surface areas $S_{LAT}$. The metal tracks T1,1, T1,2, T1,3, T1,4, T1,5, T2,1, T2,2, T2,3, T2,4, T2,5, T3,1, T3,2, T3,3, T3,4, T3,5, T4,1, T4,2, T4,3, T4,4, T4,5, T5,1, T5,2, T5,3, T5,4 and T5,5 in the capacitor device of FIG. 2 are labelled with two indices, the first index being indicative for the metal layer FL1, FL2, FL3, FL4 or FL5 where the metal track forms part of, and the second index being indicative for the lateral position of the metal track in the respective metal layer FL1, FL2, FL3, FL4 or FL5. If the capacitor device is so oriented that the metal layers FL1, FL2, FL3, FL4 or FL5 form horizontal planes, the front sides of the metal tracks T1,1, T1,2, T1,3, T1,4, T1,5, T2,1, T2,2, T2,3, T2,4, T2,5, T3,1, T3,2, T3,3, T3,4, T3,5, T4,1, T4,2, T4,3, T4,4, T4,5, T5,1, T5,2, T5,3, T5,4 and T5,5 form an array as drawn in FIG. 2. The first index r of each metal track Tr,s than corresponds to the row and the second index s to the column of the metal track in the array. Metal tracks like T2,2 and T2,3, forming part of the same metal layer FL2 and separated from each other by a single oxide track are named horizontally neighbouring tracks in this patent application. Such metal tracks have equal first indices, and second indices that differ by 1. Metal tracks like T1,2 and T2,2, forming part of metal layers FL1 and FL2 separated from each other by a single oxide layer SL1, and having respectively a bottom surface and top surface facing towards each other, are named vertically neighbouring tracks in this patent application. Such metal tracks have equal second indices, and first indices that differ by 1. Metal tracks like T1,2 and T2,3, that are in vertical direction separated by an oxide layer SL1 and in horizontal direction by an oxide track are named diagonally neighbouring tracks in this application. Such metal tracks have first indices that differ by 1 and second indices that differ by 1. The first electrically conductive path E1 interconnects all diagonally neighbouring metal tracks starting from the leftmost metal track T2,1 in the second metal layer FL2 and so constitutes a first terminal of the capacitor device. The sum of the first index r and the second index s for each metal track Tr,s coupled to this first terminal is odd. The second electrically conductive path E2 interconnects all diagonally neighbouring metal tracks starting from the leftmost metal track T1,1 of the first metal layer FL1 and so constitutes a second terminal of the capacitor device. The sum of the first index r and the second index s for each metal track Tr,s coupled to this second terminal is even. To reduce the number of connections to be made between metal tracks in the capacitor device, each metal track Tr,s is connected via an electrical conductor to the metal track Tr+1,s+1 whose first index r+1 and second index s+1 are 1 higher than its own first index r and second index s respectively. The first electrically conductive path E1 than is realised by interconnecting the leftmost metal tracks T2,1 and T4,1 of respectively the second metal layer FL2 and fourth metal layer FL4, and the second metal track T1,2 and fourth metal track T1,4 in the first metal layer FL1. The second electrically conductive path is realised by interconnecting the leftmost metal tracks T1,1, T3,1 and T5,1 of respectively the first metal layer FL1, the third metal layer FL3 and the fifth metal layer FL5, and the first metal track T1,1, the third metal track T1,3 and the fifth metal track T1,5 in the first metal layer FL1.

The capacitor device of FIG. 2, which may also be manufactured for example via a 5 layer submicron CMOS technology, is an array of parallel coupled top-bottom capacitors $C_{TB}$ and side-wall capacitors $C_{SW}$. Each top-bottom capacitor $C_{TB}$ is constituted by two vertically neighbouring metal tracks, for instance T1,2 and T2,2, and the intermediate oxide layer, for instance SL1 and has a capacitance value given by:

$$C_{TB} = \varepsilon_0 \cdot \varepsilon_r \cdot \frac{S_{TB}}{d_{TB}}$$

Herein $S_{TB}$ represents the top and bottom surface area of a metal track and $d_{TB}$ represents the thickness of the oxide layers SL1, SL2, SL3 and SL4 which is supposed to be equal for all oxide layers SL1, SL2, SL3 and SL4. This thickness $d_{TB}$ for 0.35 µm CMOS technology typically equals 0.8 à 0.9 µm. Each side-wall capacitor $C_{SW}$ is constituted by two horizontally neighbouring metal tracks, for instance T1,1 and T1,2, and the intermediate oxide track in the same metal layer, for instance FL1, and has a capacitance value given by:

$$C_{SW} = \varepsilon_0 \cdot \varepsilon_r \cdot \frac{S_{LAT}}{d_{LAT}}$$

Herein, $S_{LAT}$ represents the lateral side-wall surface area of the metal tracks and $d_{LAT}$ represents the horizontal spacing between two horizontally neighbouring metal tracks. This horizontal spacing $d_{LAT}$ for 0.35 µm CMOS technology typically equals 0.6 à 0.7 µm. Because the spacing $d_{LAT}$ between horizontally neighbouring tracks typically is smaller than the spacing $d_{TB}$ between vertically neighbouring metal tracks the capacitance realised by side-wall capacitors $C_{SW}$ is bigger than that realised by top-bottom capacitors $C_{TB}$. Moreover, fringing electrical fields FF, for example between side-wall surfaces $S_{LAT}$ of a metal track T1,5 and top or bottom surfaces $S_{TB}$ of vertically neighbouring tracks T2,5 increase the aggregate capacitance value between the first terminal E1 and second terminal E2 of the capacitor device of FIG. 2. If these fringing fields FF are not taken into account and if it is supposed that all metal tracks T1,1, T1,2, T1,3, T1,4, T1,5, T2,1, T2,2, T2,3, T2,4, T2,5, T3,1, T3,2, T3,3, T3,4, T3,5, T4,1, T4,2, T4,3, T4,4, T4,5, T5,1, T5,2, T5,3, T5,4 and T5,5 have the same dimensions, that all oxide layers SL1, SL2, SL3 and SL4 have the same thickness $d_{TB}$, that all horizontal oxide tracks between metal tracks have the same width $d_{LAT}$, and that one and the same oxide is used for the oxide layers SL1, SL2, SL3, SL4 and oxide tracks, the aggregate capacitance value realised between the first terminal E1 and second terminal E2 is given by:

$$C = 20 \cdot C_{TB} + 20 \cdot C_{SW} = 20 \cdot \varepsilon_0 \cdot \varepsilon_r \cdot \frac{S_{TB}}{d_{TB}} + 20 \cdot \varepsilon_0 \cdot \varepsilon_r \cdot \frac{S_{LAT}}{d_{LAT}}$$

If it is assumed that the capacitor device of FIG. 2 occupies the same aggregate silicon area S as the capacitor device of FIG. 1, the capacity per unit silicon area or capacitor density obtained for the capacitor device of FIG. 2 with the new array-like structure equals:

$$D_C = \frac{C}{S} = 20 \cdot \varepsilon_0 \cdot \varepsilon_r \cdot \frac{S_{TB}}{d_{TB} \cdot S} + 20 \cdot \varepsilon_0 \cdot \varepsilon_r \cdot \frac{S_{LAT}}{d_{LAT} \cdot S}$$

Because the width $d_{LAT}$ of the oxide tracks is smaller than the thickness $d_{TB}$ of the oxide layers, the contribution of the side-wall capacitors $C_{SW}$ significantly increases the capacitor density in comparison with capacitor devices with the known stacked structure. With the submicron CMOS technologies available at the time the invention was made, a capacity increase per unit area of 30%, or an area gain per unit capacitance of 30% is obtainable. The linearity of the capacitors, i.e. the fact the capacitance value is independent of the voltage drop over the capacitor, does not decrease for a capacitor with the structure according to the present invention in comparison with a capacitor with the known stacked structure.

It is noticed that in the above given description of the structure of the capacitor device according to the present invention, the terms horizontal, vertical, and diagonal are relative terms, assuming that the capacitor device is turned in a position wherein the metal layers FL1, FL2, FL3, FL4 and FL5 and oxide layers SL1, SL2, SL3 and SL4 constitute horizontal planes.

It is further remarked that the technology used to manufacture the capacitor device, i.e. the submicron CMOS technology, is only given by way of example. A person skilled in the art of microelectronics will appreciate that several multi-layer technologies are suitable to manufacture a capacitor device wherein horizontally oriented side-wall capacitors and vertically oriented top-bottom capacitors are parallel coupled to reduce the required area to realise a given aggregate capacitance value.

Another remark is that in the above described embodiment, the number of metal layers, oxide layers, and the number of metal tracks within one metal layer are given as an example. Any skilled person appreciates that the selected technology to manufacture the capacitor device puts constraints on the number of layers and on the number of tracks that can be realised on a certain given area. As technology evolves, these numbers typically increase, so that it may be expected that the currently proposed structure for a capacitor device will become more and more interesting.

While the principles of the invention have been described above in connection with specific apparatus, it is to be clearly understood that this description is made only by way of example and not as a limitation on the scope of the invention.

What is claimed is:

1. A layered capacitor device comprising a parallel coupling of a plurality of capacitors ($C_{TB}$, $C_{SW}$) constituted by vertically alternating first layers and second layers, said second layers consisting of electrically insulating material, wherein said first layers comprise horizontally alternating electrically conducting tracks and electrically insulating tracks, whereby top-bottom capacitors are constituted by two vertically neighboring said electrically conducting tracks and a second layer of said second layers therebetween, and whereby side-wall capacitors are constituted by two horizontally neighboring said electrically conducting tracks and an electrically insulating track of said electrically insulating tracks therebetween, said top-bottom capacitors and said side-wall capacitors constituting said plurality of capacitors.

2. A layered capacitor device according to claim 1, wherein diagonally neighboring ones of said electrically conducting tracks are electrically connected, whereas vertically neighboring ones and horizontally neighboring ones of said electrically conducting tracks are not electrically connected, to thereby realize said parallel coupling of said capacitors between a first electrically conducting node (E1) and a second electrically conducting node.

3. Integrated circuit comprising at least one capacitor device as defined by claim 1.

* * * * *